US006426291B1

(12) United States Patent
Hu et al.

(10) Patent No.: US 6,426,291 B1
(45) Date of Patent: Jul. 30, 2002

(54) METHOD OF CO-DEPOSITION TO FORM ULTRA-SHALLOW JUNCTIONS IN MOS DEVICES USING ELECTROLESS OR ELECTRODEPOSITION

(75) Inventors: Yongjun Jeff Hu, Boise; Li Li, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 09/653,423

(22) Filed: Aug. 31, 2000

(51) Int. Cl.[7] ................................................ H01L 21/44

(52) U.S. Cl. ....................... 438/682; 438/656; 438/558; 438/567

(58) Field of Search ................................ 438/682, 683, 438/655, 656, 558, 567, 680, 369

(56) References Cited

U.S. PATENT DOCUMENTS

| | | | | |
|---|---|---|---|---|
| 5,356,837 A | * | 10/1994 | Geiss et al. ................. | 438/682 |
| 5,536,684 A | * | 7/1996 | Dass et al. .................. | 438/682 |
| 5,763,923 A | | 6/1998 | Hu et al. | |
| 5,874,351 A | | 2/1999 | Hu et al. | |

OTHER PUBLICATIONS

Lopatin, S., Shacham–Diamand, Y., Dubin, V., Vasudev, P.K., Kim, Y., and Smy, T., “Characterization of Electroless Cu, Co, Ni and Their Alloys for ULSI Metallization”, Conference Proceedings ULSI XIII 1998 Materials Research Society, p. 437–443.

* cited by examiner

*Primary Examiner*—Caridad Everhart
(74) *Attorney, Agent, or Firm*—Knobbe Martens Olson & Bear LLP

(57) ABSTRACT

A method of forming ultra-shallow source/drain junctions in MOS devices by co-depositing cobalt or nickel with an n or p-type dopant following a seeding step. The co-deposition of cobalt or nickel with the dopant is done either via an electroless or an electrodeposition. The co-deposited Co(P) or Ni(P) is capped with a layer of PVD elemental titanium. The wafer is then annealed such that the titanium partially alloys with the cobalt or nickel and getters some of the cobalt or nickel limiting the thickness of the cobalt or nickel salicide which forms over exposed regions of the silicon substrate. The excess metal layers are removed with a wet etch, such as a piranha etch. A subsequent drive step forms ultra-shallow source/drain junctions using the doped cobalt or nickel salicide as a diffusion source.

31 Claims, 2 Drawing Sheets

100
122
102, 150, 154
124
110
114
120
116
112
106, 152
104

METHOD OF CO-DEPOSITION TO FORM ULTRA-SHALLOW JUNCTIONS IN MOS DEVICES USING ELECTROLESS OR ELECTRODEPOSITION

BACKGROUND OF THE INVENTION

1. Field of the Invention

The present invention relates to semiconductor processing and, in particular, to a method of electroless and electrodeposition of near-noble metals with phosphorus or boron to form ultra-shallow junctions using a salicide as a diffusion source.

2. Description of the Related Art

The ever-present desire in the semiconductor industry for reduced costs and increased performance and yields has led to ever more highly integrated designs. In order to accommodate more devices on a given wafer, there is a corresponding drive to reduce device feature sizes. However, reducing feature size while maintaining predictable and stable device performance and satisfactory yields is a continuing challenge to semiconductor processes and materials. One difficulty found in MOS processing is achieving increasingly shallow source/drain junctions while maintaining predictable and desired device performance.

The source/drain junctions are formed in an NMOS device, for example, by creating two separate n-type regions in an underlying lightly doped p-type well. The junctions are defined as the places in the dopant gradient where the concentration of n and p types majority carriers are equal, i.e., where the material transitions from a p-type to an n-type. In an NMOS device, a gate region is placed between and adjacent the source and drain regions and insulated from the underlying substrate such that minimal current can flow through the gate terminal. The two n-type regions separated by the p-type well form two back-to-back pn junctions between the source and drain terminals and, ideally, current flow between the source and drain terminals is controlled by a voltage applied to the gate.

A positive voltage applied to the gate creates an electrostatic field in the p-type well under the gate insulator, which attracts electrons from the source and drain n-type regions. When a sufficiently high voltage, known as the threshold voltage, is applied to the gate, an inverted channel of electron carriers extends under the gate between the source and drain and thus a current between the source and drain will flow in response to a voltage applied between the source and drain. When the gate voltage is below the threshold voltage, the inverted channel should not extend between the source and drain and current flow between the source and drain is limited to reverse leakage currents. The leakage current needs to remain low so that an applied voltage between the source and drain does not result in a significant current flow absent an applied gate voltage. Otherwise, circuits employing the devices will not function as intended.

It can be appreciated from the geometry of a MOS device that smaller device sizes, in particular a shorter distance between the source and drain, i.e. a shorter gate, will allow the conducting channel between the source and drain to form more rapidly and allow the device to operate at higher switching speeds. As the device dimensions are reduced to achieve higher packing densities and improved performance, the junction depth needs to be scaled in proportion to the junction length.

An ultra-shallow junction is currently considered to be in the range of 600–700 Å. Achieving an effective ultra-shallow source/drain junction is a great challenge using conventional implantation based MOS device fabrication methods. Accurately controlling the dopant implantation for an ultra-shallow junction is difficult with available ion implantation techniques and processes. When shallower implantations are attempted, implantation beam stability suffers as the implantation energy is decreased, which makes it more difficult to accurately aim and regulate the ion implant beam. Lateral deflections and additional penetration from the source/drain target area and depth using current implantation methods are generally on the order of 1000 Å in dimension.

As mentioned, the junctions are formed, in NMOS devices, by placing n-type regions in a p-type well such that the n-type regions are adjacent the gate structure. These defects, particularly the lateral deflections, result in n-type dopants coming to rest in the lightly p-type doped region under the gate. The presence of n-type carriers under the gate region increases parasitic capacitance between the gate and the source and drains and can increase the magnitude of leakage current. Source/gate and drain/gate parasitic capacitance requires additional current to overcome and thus slow the time response of the NMOS and circuits employing it. Higher leakage currents increase undesirable power drain by allowing current to flow when the NMOS is supposed to be "off". Excessively high leakage currents can approach the "on" state current levels and render the device useless as a switch/amplifier.

In addition to the above mentioned problems, ion implantation physically shoots ions into the silicon crystalline wafer, which damages the crystalline structure. The damage to the crystalline structure can result in increased leakage currents and parasitic capacitance. Typically, a subsequent annealing process is required to repair the crystalline damage following implantation. However, a subsequent anneal step adds complexity and cost to the fabrication process and can also result in unwanted diffusion of species in other regions of the semiconductor device.

It can be appreciated that there is an ongoing need in the field for a reliable, cost-effective method of creating reliable ultra-shallow source/drain junctions. The method should result in minimal parasitic capacitances and low leakage currents. It would be an advantage to employ a process that does not damage the crystal structure and thus require subsequent repair steps. It would be a further advantage for the method to simultaneously include other requisite fabrication processes, such as forming ohmic contacts to the active regions of the device.

SUMMARY OF THE INVENTION

The aforementioned needs are satisfied by the process for forming shallow source/drain junctions in a semiconductor substrate of the present invention. In one aspect, the process comprises forming a doped metallic layer on a first surface of the semiconductor substrate adjacent a region of the substrate that is to receive the source/drain region. The process also includes transforming the doped metallic layer into a low resistance contact layer adjacent the region of the substrate that is to receive the source drain region and inducing the dopant within the doped metallic layer to diffuse into the semiconductor substrate so as to form the source/drain region.

As the dopant within the doped metallic layer is diffused into the substrate, the problems associated with implantation are generally avoided. In one embodiment, the diffusion of the dopant occurs as a result of an anneal process that results in the dopant traveling into the substrate in a controlled fashion to a desired depth with less crystalline damage to the substrate. In one aspect, the diffusion of the dopant occurs at the same time as the transformation of the doped metallic layer into a low resistance contact layer and, in one embodiment, the diffusion and the transformation occurs as a result of annealing the doped metallic layer.

In another aspect of the invention, a diffusion control layer is formed on the doped metallic layer and the control layer is selected so that it interacts with the doped metallic layer during transformation of the doped metallic layer into the low resistance contact layer so as to limit the resulting thickness of the low resistance contact layer. In this way, a shallow source/drain junction can be formed and the diffusion of the low resistance contact layer into the semiconductor wafer can be more readily controlled.

In one embodiment, forming a doped metallic layer comprises first sputtering a layer of elemental near-noble metal, such as cobalt (Co) or nickel (Ni). Then, a layer of Co or Ni is electrodeposited or deposited in an electroless process along with no more than 10% dopant such as phosphorus (P). Thus the doped metallic layer comprises co-deposited Co(P) or Ni(P) with the P concentration no more than 10 atomic percent. The initial sputtering of the elemental Co or Ni acts as a seed for the subsequent co-deposition process. This helps to insure complete step coverage around the boundaries of the source and drain regions during the co-deposition.

In this embodiment, transforming the doped metallic layer comprises exposing the silicon substrate and associated structures to a rapid thermal processing. The RTP causes the Co or Ni doped metallic layer that is adjacent exposed regions of the substrate at the source and drain regions to form a salicide with the exposed silicon while simultaneously trapping the P dopant. Thus, a Co(Si) or Ni(Si) is formed above the source and drain regions with dopant (P) trapped within the salicide. The salicide has a work function intermediate to a metalization material and the doped silicon of the source/drain and thus forms a low resistance, ohmic contact to the active source and drain regions in a subsequent metalization process.

In this embodiment, inducing the diffusion of the dopant into the substrate occurs with dopant atoms contained within the grown salicide structures adjacent the source and drain regions. Inducing the diffusion comprises exposing the substrate and associated structures to the elevated temperatures of an anneal which induces the dopant atoms to thermally migrate into the silicon substrate along an error function gradient. Diffusing the dopant into the substrate offers the advantage that the junction depth is controlled by the anneal parameters and the constituency of the doped salicide and is not subject to the high minimum implant depth restrictions that are imposed on an ion implantation process. In addition, the diffusion process of the present invention incurs significantly less crystalline damage than a typical ion implant. Thus, a subsequent crystal repair step is not needed.

In this embodiment, the method includes forming a control layer atop the doped metallic layer, which comprises a layer of elemental titanium (Ti). The control layer of titanium is placed atop the doped metallic layer before transforming the doped metallic layer into a low resistance contact and inducing the dopant to diffuse into the semiconductor substrate. The control layer, titanium in this embodiment, partially alloys with the metal component of the doped metallic layer, Co or Ni. This Ti and Co or Ni alloy is resistant to silicidification and thus limits the thickness of the low resistant contact layer that is formed in a subsequent step. Limiting the thickness of the low resistance contact layer is desirable because a thinner contact layer will have a lower resistance than a thicker layer of the same composition.

These and other objects and advantages of the present invention will become more fully apparent from the following description taken in conjunction with the accompanying drawings.

DETAILED DESCRIPTION OF THE PREFERRED EMBODIMENT

Reference will now be made to the drawings wherein like numerals refer to like parts throughout. The method of forming ultra-shallow junctions 100 will first be described with respect to an NMOS 102 device, however, it should be appreciated that this description is simply exemplary and that the process can also be used with PMOS devices or any other known semiconductor technology without departing from the spirit of the present invention. An NMOS 102 is a well known semiconductor device that may be used alone, in combination with other NMOS 102 devices, or with PMOS 150 devices in a CMOS technology in a variety of methods that are well known to those skilled in the art. The method of forming ultra-shallow junctions 100 provides the capability of forming more accurately controllable and shallower junctions in a device silicon substrate 104 to thereby allow smaller device dimensions, higher circuit density and yields, and greater economy of manufacture in a manner that will be described in greater detail below.

The NMOS 102 device comprises a silicon substrate 104. The silicon substrate 104 is preferably a <100> high purity silicon wafer lightly doped n-type and fabricated in a well known manner. The silicon substrate 104 provides a physical platform and reactive material for fabrication of the NMOS 102 devices in a manner that will be described in greater detail below. A p-type well 106 is formed in the silicon substrate 104 in a well known manner. The p-type well 106 provides the p-type semiconductor necessary for the formation of a n-type channel needed for NMOS 102 operation and also as a region for subsequent diffusion of n-type dopants to form the source and drains of the NMOS 102 device in a manner that will be described in greater detail below.

Figure 1:
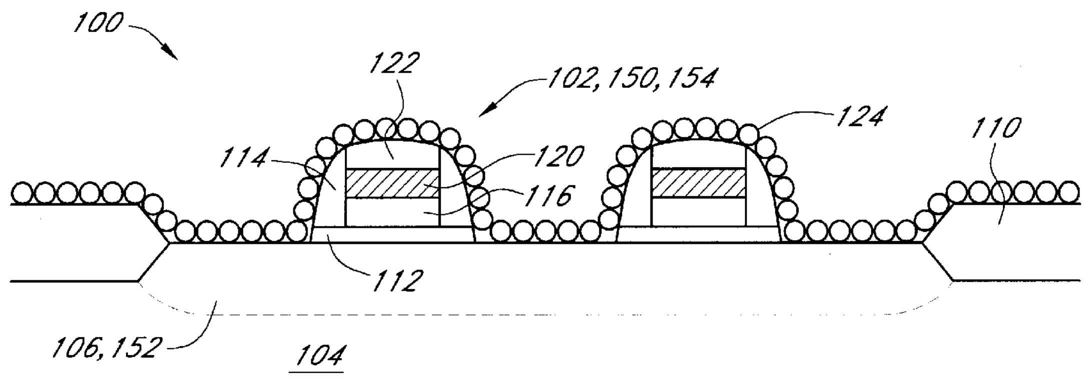
FIG. 1 is a schematic illustration of a semiconductor substrate having a gate structure formed thereon as it receives a seeding layer used to form a doped metallic layer.

The NMOS 102 comprises isolation structures 110. The isolation structures of this embodiment are formed of silicon dioxide ($SiO_2$) which is grown and then selectively etched to produce the structure shown in FIG. 1 in a manner well known in the art. The isolation structures 110 electrically isolate each NMOS device from other devices formed on the silicon substrate 104 to allow each device to operate independently.

The NMOS 102 device also comprises a gate oxide 112. The gate oxide 112 of this embodiment is a grown layer of silicon dioxide. The gate oxide 112 electrically insulates a poly-silicon gate conductor 116 from the underlying p-type well 106 and thus allows the poly-silicon gate conductor 116 to achieve the field effect necessary to the operation of the NMOS 102. The polysilicon gate conductor 116 is preferably a highly doped n-type polysilicon formed in a well known manner.

Overlying the poly-silicon gate conductor 116 is a metal strapping layer 120. In one embodiment, the metal strapping layer comprises titanium nitride. The metal strapping layer 120 electrically connects multiple NMOS devices 102 together. Overlying the metal strapping layer 120 is a cap layer 122. The cap layer 122 electrically insulates the metal strapping layer 120. The cap layer 122 comprises an electrical insulator such as silicon dioxide or silicon nitride and is placed in a well known manner.

The NMOS 102 device also comprises sidewalls 114. The sidewalls 114 are preferably formed from silicon dioxide that is anisotropically etched in a well known manner to produce the structures shown in FIG. 1. The sidewalls 114 electrically isolate the gate structures from other device regions.

Figure 2:
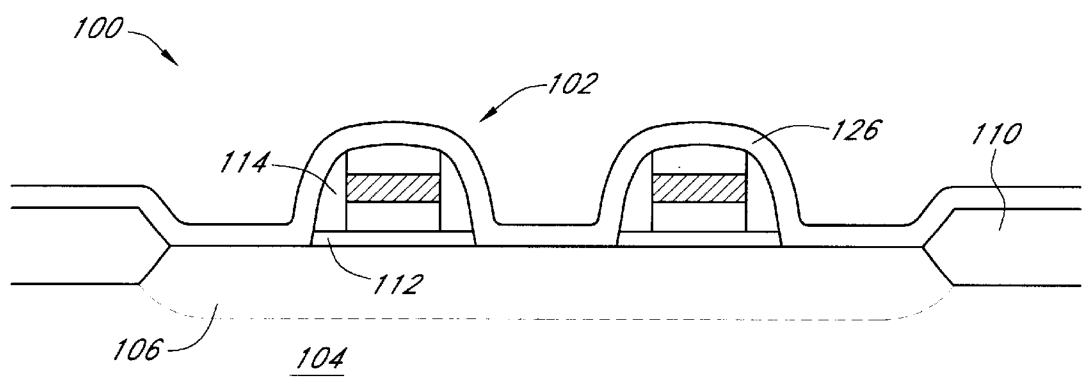
FIG. 2 is a schematic illustration of the semiconductor substrate of FIG. 1, illustrating a electroless or electrodeposition step used to further form the doped metallic layer.

The preceding structures and methods are well known in the semiconductor processing art. Following their fabrication, a first metallic layer of elemental cobalt (Co) or nickel (Ni) seed 124 approximately 50 Å thick is deposited using a sputtering or PVD technique well known in the art. The Co or Ni seed 124 assists the growth of a cobalt-phosphorus Co(P) or nickel-phosphorus Ni(P) layer in a subsequent deposition process. The Co or Ni seeded should be the same as the Co(P) or Ni(P) to be deposited subsequently FIG. 2 illustrates the electroless or electrodeposition 126 of a doped metallic layer of Co(P). With an electrodeposition 126 process, the silicon substrate 104 is connected as the cathode. The bath for the electrodeposition 126 comprises $Co_3P$. The electrodeposition 126 takes place at a bath temperature of approximately 20° C. for a duration of 10 minutes. The applied voltage is approximately −1V. An electroless deposition 126 process proceeds under the reaction $M^{n+}+ne^{-}\rightarrow M$. The electroless deposition 126 bath preferably has a composition of $Co_3P+H_2PO_2$. The electroless deposition 126 takes place at a bath temperature of approximately 20° C. for a duration of approximately 10 minutes. $H_2PO_2$ is used as a reducing agent. The P should be limited to no more than 10 atomic percent in the deposited layer in order to ensure that a subsequent salicidification process can proceed as needed. It should be appreciated by those skilled in the art that a deposition 126 of a doped metallic layer of Ni(P) can be performed in a substantially similar manner by substituting Ni for Co in the above described process.

Figure 3:
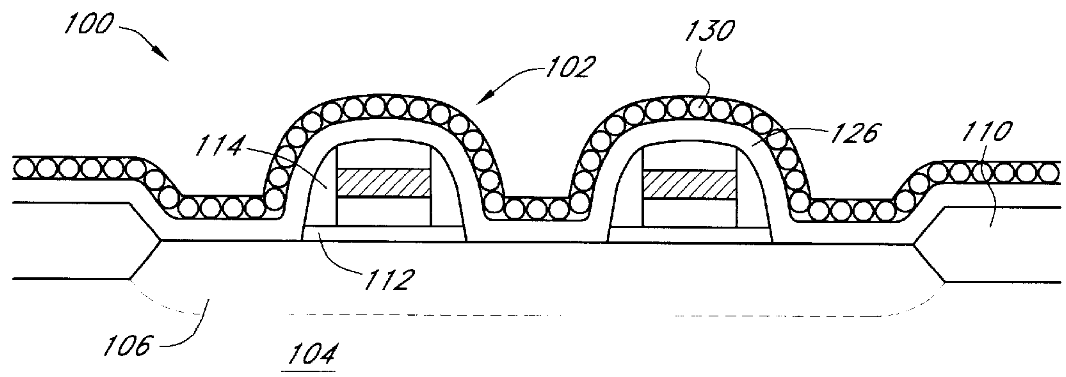
FIG. 3 is a schematic illustration of the semiconductor substrate of FIG. 2, illustrating the formation of a control layer on the doped metallic layer.

FIG. 3 shows a deposition process of a silicide control layer of Ti 130. A layer of elemental Ti 130 approximately 100 Å thick is deposited by a CVD or PVD process in a well known manner. The Ti 130 partially alloys with the previously deposited Co in a subsequent annealing step. The alloying of Ti 130 with Co binds up or getters a portion of the deposited Co. The Ti/Co alloy does not readily react with the underlying Si to form a silicide. This helps to control the salicide thickness of a subsequent salicidification process.

Figure 4:
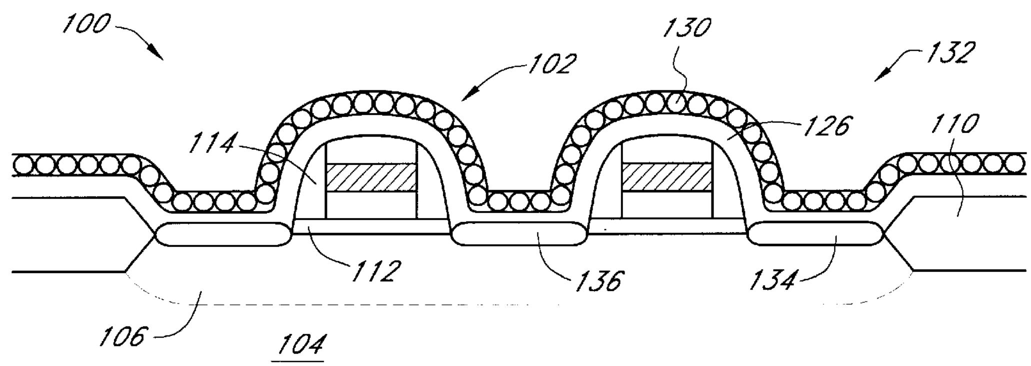
FIG. 4 is a schematic illustration of the semiconductor substrate of FIG. 3, illustrating the transformation of the doped metallic layer into a low resistance contact.

Following the Ti 130 deposition, the method of forming ultra-shallow junctions 100 comprises a transforming annealing or rapid thermal processing (RTP) process 132 as shown in FIG. 4 to form a desired salicide 134. The annealing or RTP 132 comprises exposing the silicon substrate 104 and associated structures and layers to a temperature of approximately 550° C. for a duration of approximately 30 seconds. The annealing or RTP 132 induces the deposited Ti 130 to partially alloy with the deposited Co(P) 126. The remaining Co reacts with the exposed silicon in the p-type well 106 in the exposed source/drain regions 136 to form a cobalt salicide Co(Si) 134. The P is trapped within the grown salicide 134.

Figure 5:
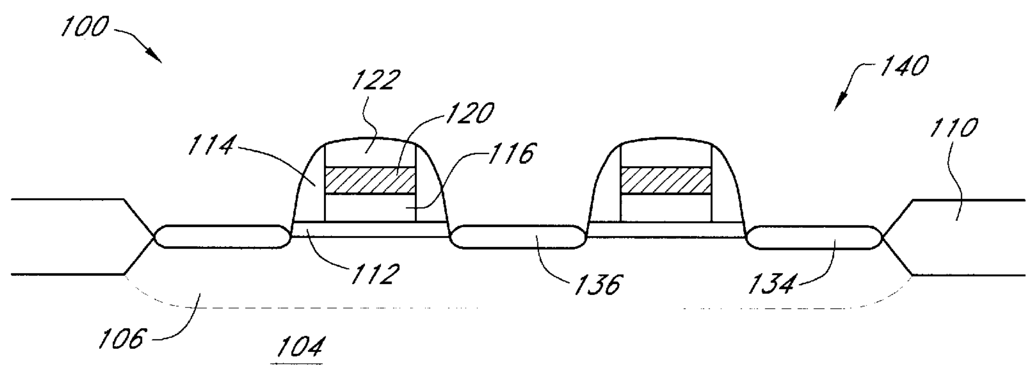
FIG. 5 is a schematic illustration of the semiconductor substrate of FIG. 4, illustrating the removal of portions of the metallic layer.

Following the growth of the salicide 134, the method of forming ultra-shallow junctions 100 comprises removing the remaining Ti 130 and deposited Co(P) 126 with a wet etch process 140 as shown in FIG. 5. In the preferred embodiment, the wet etch 140 comprises employing a piranha etch. The piranha etch comprises exposing the wafer and associated structures to a solution of $H_2SO_4$:$H_2O_2$ in a 3:1 ratio. The piranha etch is prepared and used in a well known manner. The wet etch 140 selectively removes the silicide control layer of Ti 130 and doped metallic layer of Co(P) 126, while minimally removing the grown salicide 134, isolation structures 110, sidewalls 114, cap layer 122, and gate oxide 112.

Figure 6:
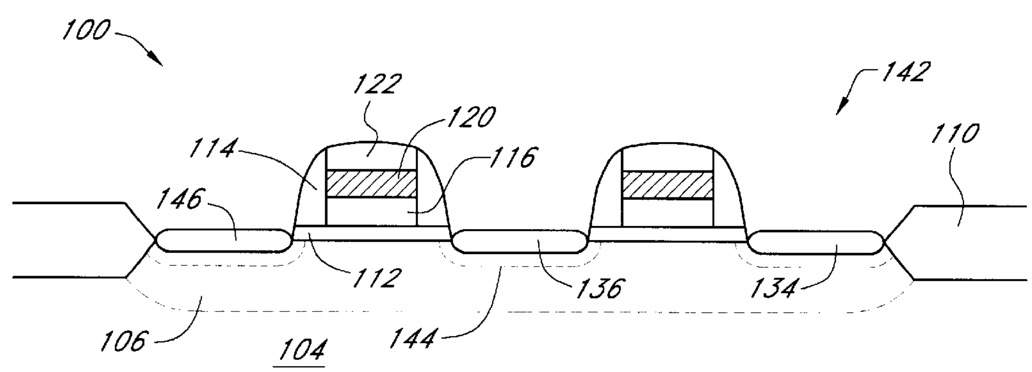
FIG. 6 is a schematic illustration of the semiconductor substrate of FIG. 5, illustrating the formation of a shallow source/drain region from the doped metallic layer.

Following the wet etch process 140, the method of forming ultra-shallow junctions 100 comprises a drive step 142 as shown in FIG. 6. The drive step 142 comprises exposing the silicon substrate 104 with the associated structures previously described to a temperature of approximately 950° C. for approximately 20 seconds. The drive step 142 selectively induces the P atoms trapped in the salicide 134 to diffuse into the p-type well 106. The Co atoms are substantially retained within the salicide 134, while the P atoms, being of lower atomic number, are more readily driven into the p-type well 106 at the elevated temperature of the drive step 142. The migration of the n-type P atoms forms an ultra shallow n-type region in the p-type well 106 and thus forms the ultra shallow junction 144 of the method of forming ultra-shallow junctions 100. The remaining salicide 134 provides an ohmic contact 146 for a subsequent known metalization process. It should be appreciated by one skilled in the art that, in the processes previously described, Ni can be substituted for the Co referred to herein.

In a complementary manner, the method of forming ultra-shallow junctions 100 comprises an embodiment for creating PMOS 150 devices. The structures and process of the method of forming ultra-shallow junctions 100 in PMOS 150 is substantially identical to that previously described with respect to NMOS 102 devices except that an n-type well 152 is substituted for the p-type well 106 and a p-type dopant, such as boron, is substituted for the n-type phosphorus. It should also be appreciated that one skilled in the art can combine the method of forming ultra-shallow junctions 100 for NMOS 102 and PMOS 150 devices to create a CMOS 154 technology.

The method of forming ultra-shallow junctions 100 employs a diffusion process to form the ultra-shallow junction and thereby avoids the crystalline damage and minimum implantation depth restrictions of ion implantation methods. The seeding of the cobalt or nickel along with the subsequent electroless or electro co-deposition process provides better step coverage of device features for the doped cobalt or nickel layer. The improved step coverage enables the diffusion process to occur more precisely as intended, which gives more predictable device performance and correspondingly higher production yields.

The method of forming ultra-shallow junctions 100 also comprises forming a doped salicide adjacent the source/drain regions. The salicide both forms a low resistance contact and acts as a dopant source for the diffusion process. The cobalt or nickel salicide has a fine grain structure that helps to make the cobalt or nickel salicide a good dopant diffusion source. Employing the salicide both as a low resistance contact and as a dopant diffusion source reduces fabrication steps which simplifies the fabrication process, provides fewer potentials for contamination, and correspondingly reduces costs and improves yields.

The method of forming ultra-shallow junctions 100 also includes forming the titanium layer. The titanium partially forms an alloy with the cobalt or nickel, which is resistant to the salicide growth. Thus, the method of forming ultra-shallow junctions 100 automatically includes provision for limiting the thickness of the salicide layer while still providing an adequate dopant source. This allows the diffusion process to proceed as needed while maintaining a desirably thin salicide layer for a low resistance contact.

Although the preferred embodiments of the present invention have shown, described and pointed out the fundamental novel features of the invention as applied to those embodiments, it will be understood that various omissions, substitutions and changes in the form of the detail of the device illustrated may be made by those skilled in the art without departing from the spirit of the present invention. Consequently, the scope of the invention should not be limited to the foregoing description but is to be defined by the appended claims.

What is claimed is:

1. A method of forming a source/drain region of a transistor in a semiconductor substrate, the method comprising:

depositing a doped metallic layer on a first surface of the semiconductor substrate adjacent a region of the substrate that is to receive the source/drain region;

transforming the doped metallic layer into a low resistance contact layer adjacent the region of the substrate that is to receive the source/drain region; and inducing the dopant within the doped metallic layer to diffuse into the semiconductor substrate so as to form the source/drain region.

2. The method of claim 1, wherein transforming the doped metallic layer into a low resistance contact layer and inducing the dopant within the doped metallic layer to diffuse into the semiconductor substrate comprises annealing the doped metallic layer to thereby simultaneously induce diffusion of the dopant from the doped metallic layer into the semiconductor substrate and also to result in formation of a low resistance contact layer between the semiconductor substrate and the doped metallic layer.

3. The method of claim 1, wherein transforming the doped metallic layer into a low resistance contact layer comprises a first transforming process which transforms a portion of the doped metallic layer and the semiconductor substrate into the low resistance contact layer and inducing the dopant within the doped metallic layer to diffuse into the semiconductor substrate comprises a second transforming process which induces dopants within the low resistance contact layer to diffuse into untransformed semiconductor substrate.

4. The method of claim 3, wherein the first transforming process comprises a rapid thermal process and the second transforming process comprises an anneal.

5. The method of claim 2, wherein depositing the doped metallic layer on the first surface comprises positioning a first metallic layer on the first surface of a silicon substrate adjacent the region that is to receive the source/drain region.

6. The method of claim 5, wherein transforming the doped metallic layer into the low resistance contact layer comprises forming a silicide layer between the doped metallic layer and the semiconductor substrate.

7. The method of claim 6, further comprising forming a silicide control layer on top of the doped metallic layer prior to transforming the doped metallic layer into the silicide layer so that, during transformation of the doped metallic layer into the silicide layer, the silicide control layer reacts with the material of the doped metallic layer during transformation into the silicide and thereby limits the thickness of the resulting silicide layer.

8. The method of claim 7, wherein depositing the doped metallic layer on the semiconductor substrate comprises positioning a layer of phosphorus doped cobalt (Co(P)) on an n doped silicon substrate.

9. The method of claim 7, wherein depositing the doped metallic layer on the semiconductor substrate comprises positioning a layer of phosphorous doped nickel (Ni(P)) on an n doped silicon substrate.

10. The method of claim 7, wherein forming the silicide control layer on top of the doped metallic layer comprises forming a layer of titanium on top of the doped metallic layer.

11. The method of claim 2, wherein depositing the doped metallic layer on a first surface of a silicon substrate comprises:

seeding the first surface of the silicon substrate with a first metallic material; and depositing doped first metallic material onto the seeded first surface of the silicon substrate.

12. A method of forming a shallow source/drain region in a semiconductor substrate, the method comprising:

depositing a doped metallic layer on a first surface of the semiconductor substrate adjacent a region of the substrate that is to receive the source/drain region;

forming a control layer on the doped metallic layer;

transforming the doped metallic layer into a low resistance contact layer adjacent the region of the substrate that is to receive the source/drain region wherein the control layer interacts with the doped metallic layer during transformation of the doped metallic layer into the low resistance contact layer so as to limit the resulting thickness of the low resistance contact layer; and inducing the dopant within the doped metallic layer to diffuse into the semiconductor substrate so as to form the source/drain region.

13. The method of claim 12, wherein transforming the doped metallic layer into a low resistance contact layer and inducing the dopant within the doped metallic layer to diffuse into the semiconductor substrate comprises annealing the doped metallic layer to thereby simultaneously induce diffusion of the dopant from the doped metallic layer into the semiconductor substrate and also to result in formation of a low resistance contact layer between the semiconductor substrate and the doped metallic layer.

14. The method of claim 12, wherein transforming the doped metallic layer into a low resistance contact layer comprises a first transforming process which transforms a portion of the doped metallic layer and the semiconductor substrate into the low resistance contact layer and inducing the dopant within the doped metallic layer to diffuse into the semiconductor substrate comprises a second transforming process which induces dopants within the low resistance contact layer to diffuse into untransformed semiconductor substrate.

15. The method of claim 14, wherein the first transforming process comprises a rapid thermal process and the second transforming process comprises an anneal.

16. The method of claim 12, wherein depositing the doped metallic layer on the first surface comprises positioning a first metallic layer on the first surface of a silicon substrate adjacent the region that is to receive the source/drain region.

17. The method of claim 13, wherein transforming the doped metallic layer into the low resistance contact layer comprises forming a silicide layer between the doped metallic layer and the semiconductor substrate.

18. The method of claim 16, wherein depositing the doped metallic layer on the first surface of the semiconductor substrate comprises depositing a layer of phosphorus doped cobalt (Co(P)) on an n doped silicon substrate.

19. The method of claim 16, wherein depositing the doped metallic layer on the first surface of the semiconductor substrate comprises depositing a layer of phosphorous doped nickel (Ni(P)) on an n doped silicon substrate.

20. The method of claim 12, wherein forming the control layer on the doped metallic layer comprises forming a layer of titanium on top of the doped metallic layer.

21. The method of claim 16, wherein depositing the doped metallic layer on a first surface of a silicon substrate comprises:

seeding the first surface of the silicon substrate with a first metallic material; and depositing doped first metallic material onto the seeded first surface of the silicon substrate.

22. A method of forming ultra-shallow junctions in semiconductor devices, the method comprising:

forming a gate stack on a first side of a semiconductor wafer, the gate stack comprising a gate insulator layer, a conductive layer, and an isolation layer such that regions of the wafer substrate are exposed;

depositing a near-noble metal onto the wafer;

co-depositing a layer onto the near-noble metal, the layer comprising the near-noble metal and a dopant;

depositing a layer of limiting material onto the deposited near-noble metal and dopant layer;

exposing the wafer, near-noble metal and dopant layer, and the limiting material layer, to an annealing process so as to form a near-noble metal salicide adjacent exposed areas of the substrate such that dopant atoms are trapped within the salicide;

etching the wafer so as to selectively remove the limiting material and near-noble metal and dopant layers while leaving the salicide; and exposing the wafer to an elevated temperature so as to drive dopant atoms trapped within the salicide into the substrate to thereby form an ultra-shallow junction adjacent the exposed areas of the substrate.

23. The method of claim 22, wherein the near-noble metal comprises cobalt.

24. The method of claim 22, wherein depositing the near-noble metal comprises sputtering the near-noble metal.

25. The method of claim 22, wherein the near-noble metal acts as a seed for the co-deposition of near-noble metal and dopant.

26. The method of claim 22, wherein co-depositing the near-noble metal and dopant comprises an electroless deposition process.

27. The method of claim 22, wherein co-depositing the near-noble metal and dopant comprises an electrodeposition process.

28. The method of claim 22, wherein the limiting material comprises titanium.

29. The method of claim 28, wherein the annealing process causes the titanium to partially alloy with the near-noble metal.

30. The method of claim 29, wherein the partial alloying of titanium with the near-noble metal getters the near-noble metal and limits the thickness of the salicide.

31. The method of claim 22, wherein the salicide formed over exposed regions of the substrate forms ohmic contacts for a subsequent metalization process.

* * * * *